United States Patent
Fischer

[11] Patent Number: 5,923,218
[45] Date of Patent: Jul. 13, 1999

[54] DEVICE WITH AMPLIFIER MEANS INCLUDING SAFETY MEANS, AND WITH FILTER MEANS CONNECTED TO THE AMPLIFIER MEANS

[75] Inventor: Walter Fischer, Vienna, Austria

[73] Assignee: U.S. Phillips Corporation, New York, N.Y.

[21] Appl. No.: 08/854,714

[22] Filed: May 12, 1997

[30] Foreign Application Priority Data

May 31, 1996 [EP] European Pat. Off. ............... 96890092

[51] Int. Cl.$^6$ ...................................................... H02H 7/20
[52] U.S. Cl. ............................. 330/302; 330/306; 330/66
[58] Field of Search ................................. 330/298, 207 P, 330/302, 306, 65, 66, 67, 68; 327/551, 558; 381/120

[56] References Cited

U.S. PATENT DOCUMENTS 4,484,150  11/1984  Carver ..................................... 330/297

OTHER PUBLICATIONS

Data Book, "Semiconductors for Radio and Audio Systems TDA 1386T to TSA 6060", published by Walter Fischer in 1995.

*Primary Examiner*—Robert Pascal
*Assistant Examiner*—Khanh Van Nguyen
*Attorney, Agent, or Firm*—Steven R. Biren

[57] ABSTRACT

In a device comprising an amplifier with short circuit protection, and a resistor-capacitor (RC) filter connected to the amplifier output, an inductor is arranged in parallel with the filter resistor to protect the resistor.

6 Claims, 2 Drawing Sheets

DEVICE WITH AMPLIFIER MEANS INCLUDING SAFETY MEANS, AND WITH FILTER MEANS CONNECTED TO THE AMPLIFIER MEANS

BACKGROUND OF THE INVENTION

1. Field of the Invention

The invention relates to a device with a circuit arrangement comprising amplifier means for the amplification of signals, which amplifier means comprise an amplifier output, on which the amplifier means produce amplified signals, and safety means for limiting the output current of the amplifier means, the circuit arrangement further comprising filter means connected to the amplifier output of the amplifier means, which filter means are adapted to extract undesired signal components from the amplified signals and comprise a series arrangement of a capacitor and a resistor.

2. Description of the Related Art

Such a device of the type defined in the opening paragraph is known, for example, from the Data Book entitled "Semiconductors for Radio and Audio Systems TDA 1386T to TSA 6060" published by the Applicant in 1995. The Data Book discloses such a device in the form of an application circuit for an integrated device (IC) having the type designation TDA1514A.

For the processing of signals, in particular for amplifying them, the known device comprises a circuit arrangement with amplifier means, and a loudspeaker for converting amplified signals into sound waves and for reproducing the sound waves, the amplifier means of the circuit arrangement having an amplifier output connected to one terminal of the loudspeaker, which has a second terminal connected to a reference potential. In the known device the loudspeaker constitutes the load connected to the amplifier means.

In the event of a short-circuit of the output, the amplifier output is connected to the reference potential terminal, and the amplifier means will supply a comparatively large output current, as a result of which the power dissipation in the amplifier means increases strongly and, consequently, the temperature of the amplifier means rises strongly. The amplifier means of the known device include safety means which limit the output current and hence the power dissipation of the amplifier means in the case of such a short-circuit of the output, which precludes damage to the amplifier means as a result of an excessive power dissipation and a consequent excessive temperature rise in the amplifier means or an excessive temperature of the amplifier means. The safety means of the amplifier means in the known device are formed by power-increase safety means, which detect a rapid rise of the power dissipation towards a critical power dissipation, and by temperature safety means, which detect a critical temperature of the amplifier means, and they limit the output current of the amplifier means when either one of the power-increase safety means and the temperature safety means detect a critical value.

The circuit arrangement of the known device has filter means connected to the amplifier output of the amplifier means, which filter means are adapted to remove undesired high-frequency signal components from the amplified signals. Particularly signal components of amplified signals having a high frequency and lying outside a useful frequency range of the device, which range extends from approximately 0 Hz to 20 kHz, can have an adverse effect because such undesired high-frequency signal components of frequencies above the useful frequency range of the device may give rise to undesirable disturbances. If the circuit arrangement would have no filter means the undesired high-frequency signal components would not be removed from the amplified signals, which would give rise to instabilities in the circuit arrangement, in which case the circuit arrangement would also supply amplified signals to the loudspeaker when the circuit arrangement receives no signals to be amplified, which would result in undesirable disturbances. In the known device such undesired high-frequency signal components of the amplified signals are removed by the filter means, which comprise a series arrangement of a capacitor and a resistor having a low resistance of only a few ohms, the capacitor of the filter means being connected directly to the amplifier output and the resistor of the filter means being connected to the reference potential terminal. In this way the filter means are connected in parallel with the loudspeaker to the amplifier output of the amplifier means. Among those versed in the art, such filter means are referred to as a Boucherot circuit.

Such a device of the type defined in the opening paragraph has the problem that in the event of a fault condition the resistor of the filter means receive a comparatively large output current from the amplifier means, in which case the resistor of the filter means is subjected to a excessive load. Such a fault condition occurs, for example, if owing to, for example, excessive aging, a production fault which manifests itself at a later stage, or the occurrence of an overvoltage the capacitor of the filter means breaks down and then constitutes a short-circuit, in which fault condition the resistor of the filter means is connected to the output of the amplifier means via the short-circuit formed by the capacitor. The safety means of the amplifier means then do not limit the output current of the amplifier means, because the output is not short-circuited and, as a consequence, the power dissipation in the amplifier means is smaller than the critical power dissipation for the amplifier means, although a comparatively large output current is produced owing to the defective and consequently short-circuited capacitor of the filter means. In addition to the undesired high-frequency but low-power signal components already appearing across the resistor of the filter means in normal operation, this also results in a substantial portion of the low-frequency high-power signal components of the amplified signal, which in normal operation appear only across the load, and hence a substantial portion of the comparatively large output current of the amplifier means appearing across the resistor of the filter means in said situation, which resistor has only a small resistance value. If in such a known device the resistor of the filter means is a commercially available low-cost resistor, this resistor will be damaged by the comparatively large output current applied to it by the amplifier means, as a result, of which this resistor would assume an impermissibly high temperature and could catch fire. As a consequence, the whole device could then catch fire. For this reason it is known and also prescribed by safety regulations to use a safety resistor for the resistor of the filter means. When a given temperature is reached, which is lower than the impermissibly high temperature, such a safety resistor passes into an irreversible no-load condition, thus precluding any safety risk presented by an impermissibly high temperature for the safety resistor forming the resistor of the filter means. However, such safety resistors are comparatively expensive, i.e. even substantially more expensive than commercially available low-cost resistors, so that their use leads to an undesirable rise in cost of a device of the type defined in the opening paragraph.

SUMMARY OF THE INVENTION

It is an object of the invention to avoid the aforementioned problems and at the same time the aforementioned safety risk in a device of the type defined in the opening paragraph and to improve a device of the type defined in the opening paragraph substantially without any additional material means and to provide an improved device in which the resistor of the filter means is protected against overload and damage without being constructed as a safety resistor.

To achieve this object, according to the invention, a device of the type defined in the opening paragraph is characterized in that the circuit arrangement in addition comprises inductance means which constitute an inductive resistance and which are arranged in parallel with the resistor of the filter means.

In this way it is achieved that in the event of a fault condition in which the capacitor of the filter means constitutes a short-circuit, the inductance means arranged in parallel with the resistor of the filter means effectively constitute a short-circuit for the low-frequency high-power signal components of the amplified signal, as a result of which the low-frequency high-power signal components are not drained to a reference potential terminal via the resistor but via the inductance means. Thus only the high-frequency low-power signal components are applied to the resistor of the filter means in the case of a fault, which components are also applied to the resistor of the filter means in normal operation, when the capacitor does not constitute a short-circuit, and which do not overload the resistor. This has the advantage that it is not necessary to construct the resistor of the filter means as a safety resistor, but it can be formed by a commercially available low-cost resistor without any consequent safety risk.

In the case of a fault the inductance means form a short-circuit for the low-frequency high-power signal components, so that the safety means of the amplifier means detect a short-circuited output condition and advantageously limit the output current of the amplifier means, thereby precluding damage to the amplifier means, as a result of which the desired safety is guaranteed again.

In normal operation, when the capacitor of the filter means is operational, only the high-frequency low-power signal components, for which the capacitor is virtually a short-circuit, reach the parallel arrangement formed by the resistor of the filter means and the inductance means. For these high-frequency low-power signal components the inductance means practically constitute a very high impedance, so that the addition of the inductance means to the filter means has the advantage that the characteristics of the filter means for the amplified signals hardly change.

The inductance means for a device in accordance with the invention can be formed by, for example, a ferrite bead, in which case the inductance means are obtained with low material cost. However, for a device in accordance with the invention it has proved to be advantageous if the amplifier means with their safety means and the filter means as well as the inductance means are accommodated on a printed circuit board, and the inductance means are constituted by a printed conductor. By arranging the amplifier means with the safety means and the filter means as well as the inductance means on a printed circuit board a very compact and small construction of a device in accordance with the invention is possible, while in addition it has then proved to be very simple when the inductance means are formed by a printed conductor because with such a printed conductor the inductance means are obtained substantially without any additional material cost.

The inductance means of a device in accordance with the invention can be constituted by a meander-shaped printed conductor, which has the advantage that the inductance means can then be realized on a small area of the printed circuit board but have only a low inductance, because the overall inductance of the meander-shaped conductor is smaller than the sum of the inductances of the individual conductor portions. Therefore, it has proved to be very advantageous in a device in accordance with the invention if the inductance means are formed by a spiral printed conductor. A spiral printed conductor occupies only very little area on a printed circuit board, so that in an advantageous manner inductance means of particularly small area are obtained. Moreover, the overall inductance of the spiral conductor is equal to the sum of the inductances of the individual conductor portions, which has the advantage that such inductance means have a high inductance.

In a device in accordance with the invention it has further proved to be advantageous if the inductance means, which are arranged in parallel with the resistor of the filter means, are connected to the amplifier output of the amplifier means via the capacitor of the filter means. This, it is achieved that the undesired high-frequency signal components extracted by means of the capacitor are available on the node between the resistor of the filter means and the capacitor of the filter means, which has the advantage that, for example for test purposes, these undesired signal components can be displayed on an oscilloscope.

The afore-mentioned as well as further aspects of the invention will be apparent from the exemplary embodiments described hereinafter and will be elucidated by means of these exemplary embodiments.

BRIEF DESCRIPTION OF THE DRAWINGS

The invention will now be described in more detail with reference to the drawings, which show two exemplary embodiments to which the invention is not limited.

DETAILED DESCRIPTION OF THE PREFERRED EMBODIMENTS

Figure 1:
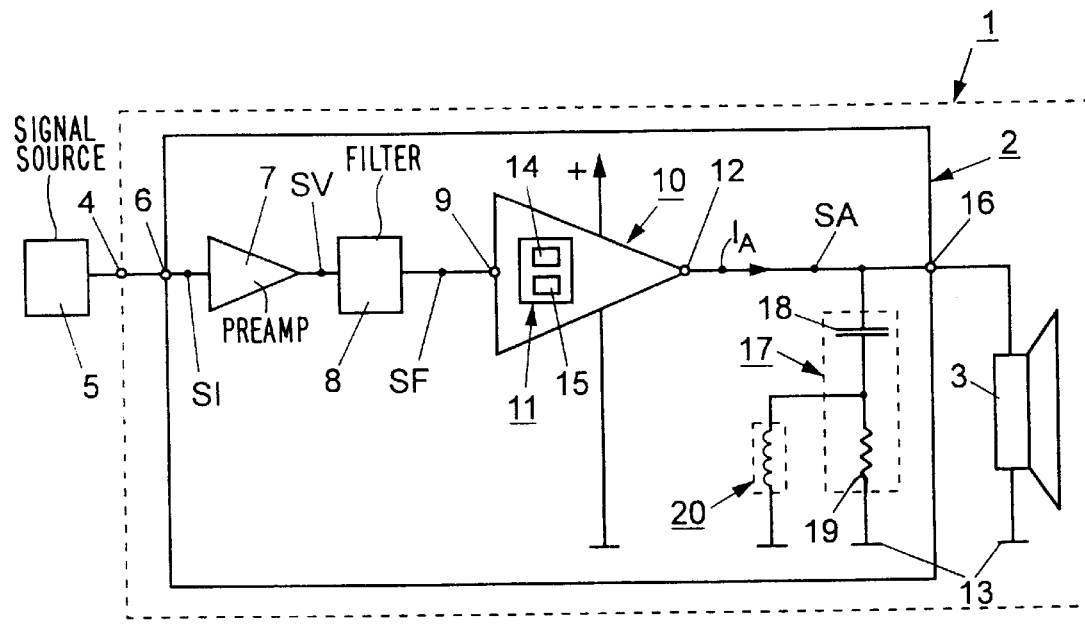
FIG. 1 is a block-schematic diagram of a device in accordance with a first exemplary embodiment of the invention, which comprises a circuit arrangement for processing and amplifying signals, which comprises amplifier means and filter means for removing undesired signal components from the amplified signals supplied by the amplifier means to a load via an amplifier output, as well as inductance means connected to the amplifier output of the amplifier means via a capacitor of the filter means, the device comprising a loudspeaker as the load connected to the circuit arrangement.

FIG. 1 shows a device 1 in accordance with the invention comprising a circuit arrangement 2 for processing and amplifying input signals SI and for supplying amplified signals SA and which comprises a loudspeaker 3, connected to the circuit arrangement 2, for converting the amplified signals SA into sound waves and for emitting the sound waves.

The device 1 has an input 4, via which the input signals can be applied to the device 1 from a signal source 5 connected to the input 4. The signal source 5 can be, for example, a radio receiver or a microphone. The input 4 of the device 1 is connected directly to an input 6 of the circuit arrangement 2 to apply input signals SI to the circuit arrangement 2. The input signals SI are amplified by a preamplifier 7 which is connected to the input 6 and which supplies preamplified input signals SV to an input filter 8 connected to the preamplifier 7. The amplified input signals SV are filtered by the input filter 8. Amplified and filtered input signals SF supplied by the input filter 8 are applied to an input 9 of amplifier means connected to the input filter 8.

The amplifier means 10 include safety means 11 for limiting the output current $I_A$ of the amplifier means 10, when necessary, thereby precluding damage to the amplifier means 10 as a result of an excessive power dissipation in the amplifier means 10 and a consequent excessive temperature rise in the amplifier means 10. The safety means 11 particularly limit the output current $I_A$ of the amplifier means 10 in a short-circuited output condition, in which an amplifier output 12, which serves to supply the amplified signals SA from the amplifier means 10, are connected to a reference potential terminal 13.

The safety means 11 of the amplifier means 10 are formed by power-increase safety means 14 and by temperature safety means 15. The power-increase safety means 14 monitor the power dissipation of the amplifier means 10 and detect a rapid rise of the power dissipation towards a critical power dissipation, which is reached in the case of the short-circuited output condition, and limit the output current $I_A$ and hence the power dissipation in the short-circuited output condition so as to preclude damage to the amplifier means 10. The temperature safety means 15 of the safety means 11 detect a critical temperature of the amplifier means 10 and limit the output current $I_A$ and hence the power dissipation of the amplifier means 10 so as to preclude damage to the amplifier means 10 as a result of an excessive temperature of the amplifier means 10.

The amplifier output 12 of the amplifier means 10 is connected to an output 16 of the circuit arrangement 2, on which output the amplified signals SA are available. The loudspeaker 2 of the device 1 has one terminal connected to the output 16 of the circuit arrangement 2. A second terminal of the loudspeaker 3 is connected to the reference potential terminal 13. The loudspeaker 3 then forms a load connected to the circuit arrangement 2.

The circuit arrangement 2 comprises filter means 17, which are connected to the amplifier output 12 of the amplifier means 10 and which serve to remove undesired signal components from the amplified signals SA, which filter means comprise a series arrangement of a capacitor 18 and a resistor 19 of a few ohms only. The capacitor 18 of the filter means 17 in the device 1 in accordance with the invention shown in FIG. 1 is connected directly to the amplifier output 12 and the resistor 19 of the filter means 17 is connected to the reference potential terminal 13. The filter means 17 thus drain high-frequency low-power signal components SA to the reference potential terminal 13. Among experts such filter means are referred to as a Boucherot circuit.

In addition, the circuit arrangement 2 advantageously comprises inductance means 20, which form an inductive resistance, which inductance means have one terminal connected to the node between the capacitor 18 and the resistor 19 of the filter means 17 and are thus connected to the amplifier output 12 via the capacitor 18, and have a second terminal connected to the reference potential terminal 13 and are thus arranged in parallel with the resistor 19 of the filter means 17.

The amplified signals SA produced on the amplifier output 12 by the amplifier means 10 have a frequency spectrum in which the frequencies range from zero hertz to a few hundreds of kilohertz. To explain the operation of the filter means 17 and the inductance means 20 it is useful to divide the frequency spectrum of the amplified signals SA into two frequency ranges for which the filter means 17 and the inductance means 20 function differently.

A first frequency range has low-frequency high-power signal components of 0 Hz to approximately 20 kHz. The low-frequency high-power signal components are converted into sound waves by the loudspeaker 3. A second frequency range of the amplified signals SA has undesired high-frequency signal components of approximately 20 kHz to a few hundreds of kHz, which are essentially removed by the filter means 17 in order to preclude undesired effects in the loudspeaker 3. If the circuit arrangement 2 would not include filter means 17, the undesired high-frequency signal components of the amplified signals SA would not be removed, which would give rise to instabilities in the circuit arrangement 2, in which case the circuit arrangement 2 would also supply amplified signals SA to the loudspeaker 3 when the signal source 5 would not supply input signals SI to the device 1 and hence to the circuit arrangement 2, which would result in undesirable effects.

In normal operation the filter means 17 present a very high impedance to the low-frequency high-power signal components of the amplified signals SA, i.e. in comparison with the impedance of the loudspeaker 3 which is disposed in parallel with the filter means 17, as a result of which the low-frequency high-power signal components are almost wholly transmitted to the loudspeaker 3. In normal operation the filter means 17 present an impedance much lower than the impedance of the loudspeaker 3 to the undesired high-frequency but low-power signal components, as a result of which the undesired high-frequency low-power signal components are drained to the reference potential terminal 13 via the filter means 17, thus precluding undesired effects. The impedance presented to the high-frequency low-power signal components drained via the filter means 17 in normal operation by the inductance means 20 is high in comparison with the resistor 19 of only a few ohms, so that in normal operation the inductance means 20 have virtually no influence on the filter action of the filter means 17.

In the case of a fault situation in the circuit arrangement 2, in which the capacitor 18 is defective and forms a short-circuit, the amplified signals SA and, consequently, also the low-frequency high-power signal components of the amplified signals SA reach the parallel arrangement formed by the inductance means 20 and the resistor 19. The inductance means 20 present an impedance which is very low in comparison with the impedance of the resistor 19 to these low-frequency high-power signal components, as a result of which the low-frequency high-power signal components are essentially drained to the reference potential terminal 13 via the inductance means 20 in the fault situation. In this fault situation the provision of the inductance means 20 advantageously prevent the low-frequency high-power signal components from being drained to the reference potential terminal 13 via the resistor 19, as a result of which the temperature of the resistor 19 does not become impermissibly high and damaging of the resistor 19 is consequently avoided. In this fault situation the provision of the inductance means 20 precludes a safety risk although the resistor 19 is advantageously formed by a commercially available low-cost resistor.

In this fault situation the high-frequency low-power signal components are drained to the reference potential terminal 13 in the same way as via the resistor 19 in normal operation because the impedance of the inductance means 20 for the high-frequency low-power signal components is substantially higher than the impedance of the resistor 19, which is only a few ohms.

In the fault situation, in which the capacitor 18 forms a short-circuit, the greater part of the signal components of the amplified signals SA and hence the greater part of the output current $I_A$ of the amplifier means 10 is drained to the reference potential terminal 13 via the inductance means 20, so that the safety means 11 of the amplifier means 10 detect a short-circuited output condition and limit the output current $I_A$ of the amplifier means 10. This prevents the amplifier means 10 from being damaged by an excess output current $I_A$ in the fault situation, in which the capacitor 18 is short-circuited and the inductance means 20 only present a very low impedance to the low-frequency high-power signal components of the amplified signals SA, so that almost an short-circuited output condition occurs.

The provision of the inductance means in the device in accordance with the invention shown in FIG. 1 has the advantage that a cheaper commercially available resistor can be used in the filter means without any safety risk in the event of a fault situation in which the capacitor of the filter means forms a short-circuit. It is particularly advantageous to construct the inductance means as a printed conductor, which will be described in more detail with reference to FIG. 2.

Figure 2:
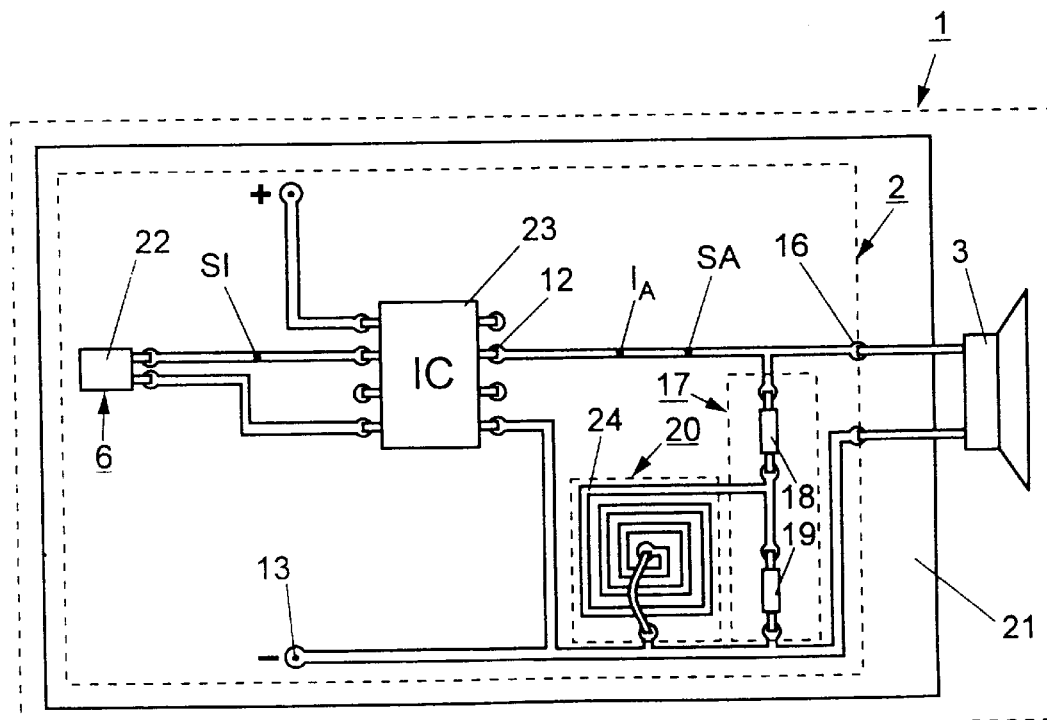
FIG. 2 shows the device in accordance with the first exemplary embodiment of the invention, whose circuit arrangement is accommodated on a printed circuit board and whose inductance means are formed by a spiral printed conductor.

FIG. 2 shows the device 1 in accordance with the invention of FIG. 1, in which the amplifier means 10 with their safety means 11 and the filter means 17 as well as the inductance means 20 are accommodated on a printed circuit board 21. The input signals SI can be applied to the circuit arrangement 2 via an input socket 22 forming the input 6 of the circuit arrangement 2, onto which socket a signal source corresponding to the signal source 5 of FIG. 1 can be plugged. The preamplifier 7 and the input filter 8 as well as the amplifier means 10 with their safety means 11 are implemented as an integrated circuit 23 (IC).

Suitably, the inductance means 20 are formed by a spiral printed conductor 24. By constructing the inductance means 20 as a printed conductor 24 on a printed circuit board 21 the inductance means 20 are obtained practically without any additional material cost. By constructing the inductance means 20 as a spiral printed conductor 24 the inductance means 20 advantageously require only a very small area on the printed circuit board 21. Moreover, this results in inductance means 20 for which the overall inductance of the spiral conductor 24 is equal to the sum of the inductances of the individual conductor portions, which in a favorable manner results in inductance means 20 having a comparatively high inductance.

Figure 3:
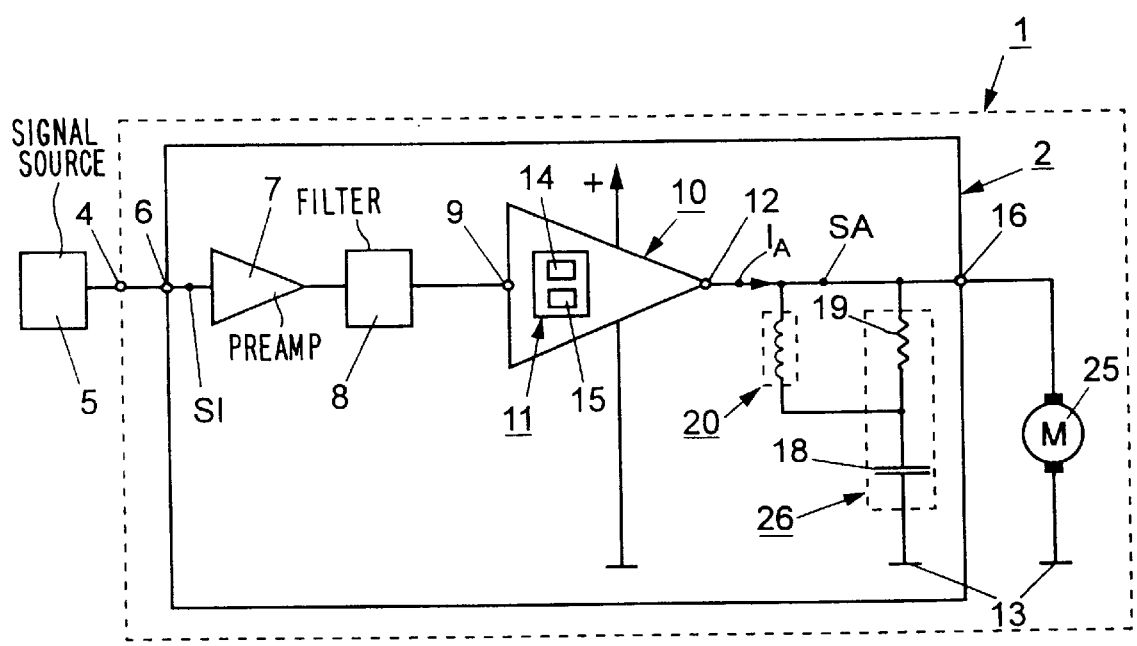
FIG. 3 shows a block-schematic diagram of a device in accordance with a second exemplary embodiment of the invention, which comprises a circuit arrangement for processing and amplifying signals, which comprises amplifier means and filter means for removing undesired signal components from the amplified signals supplied by the amplifier means to a load via an amplifier output, as well as inductance means connected directly to the amplifier output of the amplifier means, the device comprising a motor as the load connected to the circuit arrangement.

FIG. 3 shows a further device 1 in accordance with the invention, in which a speed control device is connected to the input 4 of the device 1 as a signal source 5. A motor 25 is connected as a load to the output 16 of the device 1. In the device 1 in accordance with the invention shown in FIG. 3 the motor 25 serves to drive a Compact Disc deck in a manner not shown.

Filter means 26 remove high-frequency low-power signal components from the amplified signals SA produced on the amplifier output 12 by the amplifier means 10. The filter means 26 comprise a series arrangement of the resistor 19, which is only a few ohms and which in the present case is connected directly to the amplifier output 12, and the capacitor 18, which in the present case is connected to the reference potential terminal 13.

In the device 1 shown in FIG. 3 the inductance means 20 have one terminal connected directly to the amplifier output 12 and have a second terminal connected to the node between the resistor 19 and the capacitor 18 of the filter means 26 and thus to the reference potential terminal 13 via the capacitor 18 of the filter means 26.

In normal operation the filter means 26 present a very high impedance, i.e. in comparison with the impedance of motor 25 connected in parallel with the filter means 26, to the low-frequency high-power signal components of the amplified signals SA, as a result of which the low-frequency high-power signal components are almost wholly applied to the motor 25. In normal operation the filter means 26 present an impedance much smaller than the impedance of the motor 25 to the high-frequency low-power signal components, as a result of which the high-frequency low-power signal components are drained to the reference potential terminal 13 via the filter means 26. This precludes instabilities in the circuit arrangement 2 which could cause the motor 25 to drive a Compact Disc present in the Compact Disc deck to be driven in a manner which is not in conformity with the input signals SI supplied by the speed control device forming the signals source 5.

In a fault situation in the circuit arrangement 2, in which the capacitor 18 is defective and forms a short-circuit, the amplified signals SA and, consequently, also the low-frequency high-power signal components of the amplified signals SA reach the parallel arrangement formed by the inductance means 20 and the resistor 19. The inductance means 20 present an impedance which is very low in comparison with the impedance of the resistor 19 to these low-frequency high-power signal components, as a result of which the low-frequency high-power signal components are essentially drained to the reference potential terminal 13 via the inductance means 20 in the fault situation. In this fault situation the provision of the inductance means 20 advantageously prevent the low-frequency high-power signal components from being drained to the reference potential terminal 13 via the resistor 19, as a result of which the temperature of the resistor 19 does not become impermissibly high and damaging of the resistor 19 is avoided. In this fault situation the provision of the inductance means 20 precludes a safety risk although the resistor 19 is advantageously formed by a commercially available low-cost resistor.

In this fault situation the high-frequency low-power signal components are drained to the reference potential terminal 13 in the same way as via the resistor 19 in normal operation because the impedance of the inductance means 20 for the high-frequency low-power signal components is substantially higher than the impedance of the resistor 19, which is only a few ohms.

In the fault situation, in which the capacitor 18 forms a short-circuit, the greater part of the signal components of the amplified signals SA and hence the greater part of the output current $I_A$ of the amplifier means 10 is drained to the reference potential terminal 13 via the inductance means 20, so that the safety means 11 of the amplifier means 10 detect a short-circuited output condition and limit the output current $I_A$ of the amplifier means 10. This prevents the amplifier means 10 from being damaged by an excess output current $I_A$ in the fault situation, in which the capacitor 18 is short-circuited and the inductance means 20 only present a very low impedance to the low-frequency high-power signal components of the amplified signals SA, so that almost an short-circuited output condition occurs.

The provision of the inductance means in the device in accordance with the invention shown in FIG. 1 has the advantage that a cheaper commercially available resistor can be used in the filter means without any safety risk in the event of a fault situation in which the capacitor of the filter means forms a short-circuit.

In the device 1 in accordance with the invention as shown in FIG. 3 the advantage is obtained that the undesired high-frequency signal components extracted by means of the capacitor 18 of the filter means 26 are available on the node between the resistor 19 of the filter means and the capacitor 18, which has the advantage that, for example for test purposes, these undesired signal components can be displayed on an oscilloscope.

I claim:

1. A device with a circuit arrangement comprising amplifier means for the amplification of signals, said amplifier means comprising an amplifier output for providing an output signal to a load in operation, on which output the amplifier means produces amplified signals, and safety means for limiting the output current of the amplifier means, the circuit arrangement further comprising filter means connected to the amplifier output of the amplifier means, which filter means are adapted to extract undesired signal components from the amplified signals and comprise a series arrangement of a capacitor and a resistor, said series arrangement being coupled in parallel with said load, characterized in that the circuit arrangement further comprises inductance means which comprise an inductive resistance coupled in parallel with the resistor of the filter means.

2. A device as claimed in claim 1, characterized in that the amplifier means with their safety means and the filter means as well as the inductance means are accommodated on a printed circuit board, and the inductance means are constituted by a printed conductor.

3. A device as claimed in claim 2, characterized in that the inductance means are formed by a spiral printed conductor.

4. A device as claimed in claim 1, characterized in that the inductance means, which are arranged in parallel with the resistor of the filter means, are connected to the amplifier output of the amplifier means via the capacitor of the filter means.

5. A device as claimed in claim 2, characterized in that the inductance means, which are arranged in parallel with the resistor of the filter means, are connected to the amplifier output of the amplifier means via the capacitor of the filter means.

6. A device as claimed in claim 3, characterized in that the inductance means, which are arranged in parallel with the resistor of the filter means, are connected to the amplifier output of the amplifier means via the capacitor of the filter means.

* * * * *